United States Patent
Tanimoto et al.

(10) Patent No.: US 10,190,924 B2
(45) Date of Patent: Jan. 29, 2019

(54) PRESSURE-SENSING DEVICE AND PRESSURE-SENSING TOUCH PANEL

(71) Applicant: Murata Manufacturing Co., Ltd, Nagaokakyo-shi, Kyoto (JP)

(72) Inventors: Kazuhiro Tanimoto, Nagoya (JP); Mitsunobu Yoshida, Ichihara (JP); Shigeo Nishikawa, Chiba (JP); Masamichi Ando, Nagaokakyo (JP); Hidekazu Kano, Nagaokakyo (JP)

(73) Assignee: MURATA MANUFACTURING CO., LTD., Nagaokakyo-Shi, Kyoto (JP)

( * ) Notice: Subject to any disclaimer, the term of this patent is extended or adjusted under 35 U.S.C. 154(b) by 0 days.

(21) Appl. No.: 15/026,050

(22) PCT Filed: Sep. 25, 2014

(86) PCT No.: PCT/JP2014/075521
§ 371 (c)(1),
(2) Date: Mar. 30, 2016

(87) PCT Pub. No.: WO2015/053089
PCT Pub. Date: Apr. 16, 2015

(65) Prior Publication Data
US 2016/0238466 A1    Aug. 18, 2016

(30) Foreign Application Priority Data
Oct. 7, 2013    (JP) .................. 2013-210346

(51) Int. Cl.
*G01L 1/16*    (2006.01)
*H01L 41/193*    (2006.01)
(Continued)

(52) U.S. Cl.
CPC .............. *G01L 1/16* (2013.01); *G06F 3/0414* (2013.01); *H01L 41/1132* (2013.01);
(Continued)

(58) Field of Classification Search
CPC ................. G01L 1/16; G06F 3/0414; G06F 2203/04105; H01L 41/1132; H01L 41/193; H01L 41/45
(Continued)

(56) References Cited

U.S. PATENT DOCUMENTS

| | | | | |
|---|---|---|---|---|
| 3,167,668 A | * | 1/1965 | Nesh ................... | G01H 11/08 310/337 |
| 6,060,812 A | * | 5/2000 | Toda ................... | G06F 3/0436 310/313 B |

(Continued)

FOREIGN PATENT DOCUMENTS

| CN | 102165400 A | 8/2011 |
|---|---|---|
| CN | 102484199 A | 5/2012 |

(Continued)

OTHER PUBLICATIONS

Office Action issued by the Chinese Patent Office in corresponding Chinese Patent Application No. 201480051725.1 dated Jan. 25, 2017 (13 pages including partial English translation).

(Continued)

*Primary Examiner* — Lisa Caputo
*Assistant Examiner* — Nathaniel T Woodward
(74) *Attorney, Agent, or Firm* — Buchanan, Ingersoll & Rooney PC

(57) ABSTRACT

A pressure-sensing device including a pressed component that has a contact surface to which pressure is applied by contact from a presser; a polymeric piezoelectric element that is disposed at an opposite side from the contact surface of the pressed component and that has a piezoelectric constant $d_{14}$ of 1 pC/N or more as measured at 25° C. using a stress-charge method; a curable resin layer that includes at least one selected from the group consisting of cold-setting resins, thermosetting resins, and actinic radiation-curable (Continued)

resins and that is in contact with at least part of a surface of the polymeric piezoelectric element; and an electrode that is in contact with at least part of a surface of the polymeric piezoelectric element or of a surface of the curable resin layer.

18 Claims, 7 Drawing Sheets

(51) Int. Cl.
*G06F 3/041* (2006.01)
*H01L 41/113* (2006.01)
*H01L 41/45* (2013.01)

(52) U.S. Cl.
CPC .. *H01L 41/193* (2013.01); *G06F 2203/04105* (2013.01); *H01L 41/45* (2013.01)

(58) Field of Classification Search
USPC .................................................. 73/862.625
See application file for complete search history.

(56) References Cited

U.S. PATENT DOCUMENTS

| | | | |
|---|---|---|---|
| 2012/0025674 A1 | 2/2012 | Yoshida et al. | |
| 2012/0132846 A1 | 5/2012 | Yoshida et al. | |
| 2013/0057499 A1* | 3/2013 | Ando | G06F 3/038 345/173 |
| 2013/0234988 A1 | 9/2013 | Ando et al. | |
| 2014/0339724 A1 | 11/2014 | Yoshida et al. | |
| 2016/0034073 A1 | 2/2016 | Andoh | |
| 2016/0380181 A1 | 12/2016 | Yoshida et al. | |

FOREIGN PATENT DOCUMENTS

| | | | | |
|---|---|---|---|---|
| CN | 102870080 A | | 1/2013 | |
| EP | 2662910 A1 | * | 11/2013 | ............ H01L 41/45 |
| JP | S48-048573 | | 6/1973 | |
| JP | 2002-284787 A | | 10/2002 | |
| JP | 2006-226858 A | | 8/2006 | |
| JP | 2011-222679 A | | 11/2011 | |
| JP | 4934235 B2 | | 5/2012 | |
| JP | 2012-235086 A | | 11/2012 | |
| WO | WO 2010/038466 A1 | | 4/2010 | |
| WO | WO 2010/104196 A1 | | 9/2010 | |
| WO | WO 2010/143528 A1 | | 12/2010 | |
| WO | WO 2011/125408 A1 | | 10/2011 | |
| WO | WO 2011/138903 A1 | | 11/2011 | |
| WO | WO 2012/049969 A1 | | 4/2012 | |
| WO | WO 2012/137897 A1 | | 10/2012 | |
| WO | WO 2013/089148 A1 | | 6/2013 | |

OTHER PUBLICATIONS

Extended Search Report issued by the European Patent Office in corresponding European Patent Application No. 14853064.5 dated Mar. 7, 2017 (10 pages).
Office Action issued by the Japanese Patent Office in corresponding Japanese Patent Application No. 2015-541514 dated Nov. 22, 2016 (7 pages including partial English translation).
International Search Report (PCT/ISA/210) dated Oct. 28, 2014, by the Japanese Patent Office as the International Searching Authority for International Application No. PCT/JP2014/075521.
Written Opinion (PCT/ISA/237) dated Oct. 28, 2014, by the Japanese Patent Office as the International Searching Authority for International Application No. PCT/JP2014/075521.
Office Action issued by the Taiwanese Patent Office in corresponding Taiwanese Patent Application No. 103134487 dated Jun. 13, 2018 (15 pages including partial English translation).

* cited by examiner

PRESSURE-SENSING DEVICE AND PRESSURE-SENSING TOUCH PANEL

TECHNICAL FIELD

The present invention relates to a pressure-sensing device and a pressure-sensing touch panel.

BACKGROUND ART

Although conventionally, PZT ($PbZrO_3$—$PbTiO_3$ solid solution), which is a ceramic material, has been widely used as a piezoelectric material, PZT contains lead. Thus polymeric piezoelectric materials, which are more environmentally friendly and have improved flexibility, are increasingly being used.

Currently known polymeric piezoelectric materials are poled polymers such as nylon 11, polyvinyl fluorides, polyvinyl chlorides, polyureas, polyvinylidene fluorides (β type) (PVDF), and polyvinyl fluoride-trifluoro ethylene copolymers (P(VDF-TrFE)) (75/25).

In addition to the polymeric piezoelectric materials, interest has focused on use of an optically-active polymer such as a polypeptide or a polylactic acid in recent years. Polylactic acid-type polymers are known to exhibit piezoelectricity only upon mechanical stretching.

Among the optically-active polymers, crystals of polymers such as polylactic acids have piezoelectricity arising from permanent dipoles due to the C=O bonds present in the direction of the helical axis. Especially, polylactic acids have a low volume ratio of the side chains to the main chain and a large number of permanent dipoles per unit volume, and thus can be ideal polymers among the helical chiral polymers.

Polylactic acids, which exhibit piezoelectricity only upon stretching, are known not to need to be poled and to keep the piezoelectric modulus unchanged over several years.

With regard to polymeric piezoelectric materials that include a polylactic acid, it is reported that a polymeric piezoelectric material having a high piezoelectric constant $d_{14}$ and a high transparency is provided by inclusion of a polylactic acid (see, for example, Japanese Patent No. 4934235 and WO 2010/104196).

With regard to devices that include a polylactic acid-type polymer as a polymeric piezoelectric material, a pressure-sensing touch panel that includes a piezoelectric sheet made from a polylactic acid, for example, is proposed (see, for example, WO 2010/143528, WO 2011/125408, WO 2012/049969, and WO 2011/138903). Pressure-sensing touch panels can sense not only two dimensional positional information on the touch panels, but also pressure applied to the touch panels, and thus the touch panels can be configured for three-dimensional operation.

SUMMARY OF INVENTION

Technical Problems

Polymeric piezoelectric materials used for a pressure-sensing device (an exemplary piezoelectric device) that constitutes a pressure-sensing touch panel are sensitive to heat and may exhibit change in shape and properties depending on temperature. In order to cause the polymeric piezoelectric materials to exhibit piezoelectricity, it is required to align the molecular chains in one direction. Thus, the polymeric piezoelectric materials exhibit much greater thermal deformation in one direction, compared with typical biaxially-oriented films. As a result of research, the inventors of the invention have found that in a case in which the polymeric piezoelectric materials are actually used for a pressure-sensing device, the following problems are encountered.

For example, the pressure-sensing device may use an extraction electrode electrically connected to an electrode formed around the polymeric piezoelectric material in the pressure-sensing device in order to extract an electrical signal from the electrode. To configure the extraction electrode to have electrical continuity with the above electrode, it is necessary to use, for example, an ACF (anisotropic conductive film) and apply intense heat between the electrodes.

Thus, in a case in which a polymeric piezoelectric material is used around the electrodes, the polymeric piezoelectric material may exhibit change in shape and properties by heat applied when the extraction electrode is connected.

It is possible to dispose a reinforcing plate (such as a glass epoxy or polyimide plate) that prevents the deformation on a surface opposite to a surface to which the electrodes of the polymeric piezoelectric element are connected, but the plate is insufficiently effective in preventing the change in shape and properties.

The electrode formed around the polymeric piezoelectric material may be formed as a fine electrode pattern according to the purpose. In this case, when intense heat is applied in connection of the extraction electrode or another process for producing a touch panel, the polymeric piezoelectric element exhibits change in shape and properties, and then the fine electrode pattern is misaligned, or the electrode cannot follow the change in shape and properties of the polymeric piezoelectric element and is damaged, which disturbs the functions of the device.

To handle the intense heat as described above, it is necessary to produce a pressure-sensing device that includes a polymeric piezoelectric material by, for example, forming an electrode on a substrate such as a film of a relatively high heat resistant polyethylene terephthalate (PET), polycarbonate (PC), polyvinyl alcohol (PVA), cycloolefin polymer (COP), polymethyl methacrylate (PMMA), triacetyl cellulose (TAC), or polyimide (PI), or a glass plate and bonding the substrate having an electrode formed thereon and the polymeric piezoelectric element.

In this case, however, it is necessary to form a layered body that includes an electrode formed on a substrate such as a PET film or a glass plate, which complicates the process for producing the pressure-sensing device.

And the resultant pressure-sensing device includes a substrate such as a PET film or a glass plate and a tacky adhesive layer, and thus has the problem of increased thickness and thus the problem of reduced optical properties in applications that require transparency.

In view of the foregoing, an object of the invention is to provide a thinner pressure-sensing device produced by a simpler process.

Solution to Problem

The inventors of the invention have found that a thinner pressure-sensing device produced by a simpler process can be provided by disposing a curable resin layer at a predetermined location of the pressure-sensing device, thereby achieving the invention.

Specific measures of solving the problems are as follows:
<1> A pressure-sensing device including a pressed component that has a contact surface to which pressure is applied by contact from a presser; a polymeric piezoelectric element that is disposed at an opposite side from the contact surface of the pressed component and that has a piezoelectric constant $d_{14}$ of 1 pC/N or more as measured at 25° C. using a stress-charge method; a curable resin layer that includes at least one selected from the group consisting of cold-setting resins, thermosetting resins and actinic radiation-curable resins, and that is in contact with at least part of a surface of the polymeric piezoelectric element; and an electrode that is in contact with at least part of a surface of the polymeric piezoelectric element or a surface of the curable resin layer.

<2> The pressure-sensing device according to <1>, wherein the curable resin layer includes a carbonyl group and includes a three-dimensional cross-linked structure.

<3> The pressure-sensing device according to <1> or <2>, wherein the device includes a position-sensing component.

<4> The pressure-sensing device according to any one of <1> to <3>, wherein a tacky adhesive layer is disposed between the pressed component and the polymeric piezoelectric element.

<5> The pressure-sensing device according to <3>, wherein a tacky adhesive layer is disposed between the position-sensing component and the polymeric piezoelectric element.

<6> The pressure-sensing device according to any one of <1> to <5>, wherein the polymeric piezoelectric element has a repeating unit structure that has at least one functional group selected from the group consisting of a carbonyl group and an oxy group.

<7> The pressure-sensing device according to any one of <1> to <6>, wherein the polymeric piezoelectric element includes an optically-active helical chiral polymer having a weight-average molecular weight of from 50,000 to 1,000,000, and has a standardized molecular orientation MORc of from 2.0 to 10.0 as measured based on a reference thickness of 50 μm using a microwave transmission-type molecular orientation meter, an internal haze of 50% or less as determined using visible light, and a product of a standardized molecular orientation MORc and a crystallinity measured by DSC of from 25 to 700.

<8> The pressure-sensing device according to <7>, wherein the internal haze is 5% or less.

<9> The pressure-sensing device according to <7> or <8>, wherein the internal haze is 2.0% or less.

<10> The pressure-sensing device according to any one of <7> to <9>, wherein the internal haze is 1.0% or less.

<11> The pressure-sensing device according to <7>, wherein the helical chiral polymer is a polylactic acid-type polymer that has a main chain having a repeating unit represented by the following Formula (1):

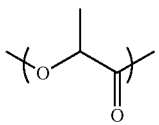

(1)

<12> The pressure-sensing device according to <7> or <11>, wherein the helical chiral polymer has an optical purity of 95.00% ee or more.

<13> The pressure-sensing device according to any one of <7>, <11>, or <12>, wherein the polymeric piezoelectric element includes the helical chiral polymer in an amount of 80% by mass or more.

<14> The pressure-sensing device according to any one of <1> to <13>, wherein the device further includes an extraction electrode that is electrically connected to the electrode.

<15> A pressure-sensing touch panel including the pressure-sensing device according to any one of <1> to <14> and a display device.

Effects of Invention

The invention provides a thinner pressure-sensing device produced by a simpler process.

DESCRIPTION OF EMBODIMENTS

[Pressure-Sensing Device]

Figure 1:
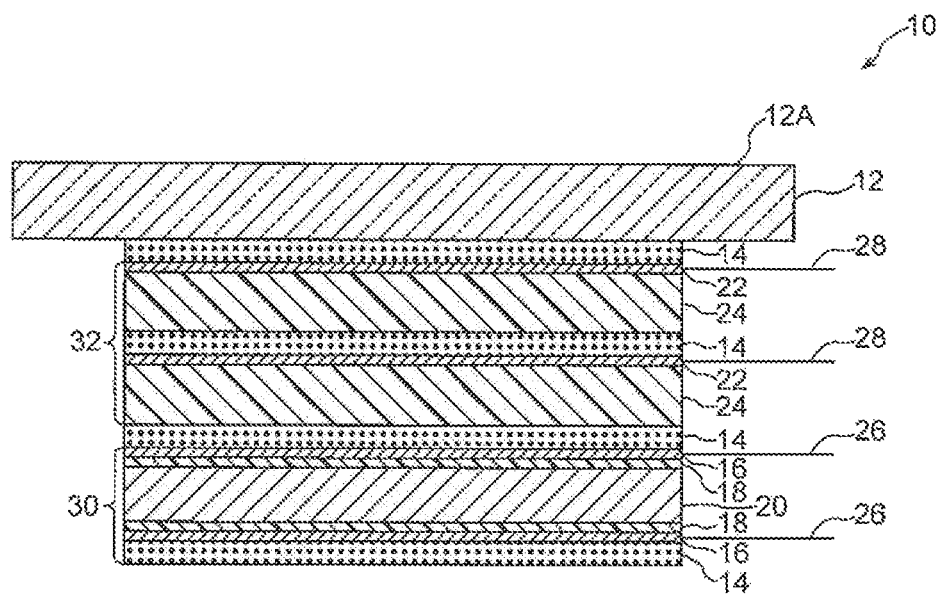
FIG. 1 is a cross-sectional view that schematically illustrates a longitudinal cross-section of an exemplary pressure-sensing device that includes a pressure-sensing device according to an embodiment of the invention.

The pressure-sensing device of the invention includes a pressed component that has a contact surface to which pressure is applied by contact from a presser; a polymeric piezoelectric element that is disposed at an opposite side from the contact surface of the pressed component and that has a piezoelectric constant $d_{14}$ of 1 pC/N or more as measured at 25° C. using a stress-charge method, a curable resin layer that includes at least one of a cold-setting resin, a thermosetting resin or an actinic radiation-curable resin, and that is in contact with at least part of a surface of the polymeric piezoelectric element; and an electrode that is in contact with at least part of a surface of the polymeric piezoelectric element and a surface of the curable resin layer.

In the invention, the hard curable-resin layer is in contact with at least part of a surface of the polymeric piezoelectric element. Thus, the curable resin layer functions as a support of the polymeric piezoelectric element and can suppress the dimensional change in the polymeric piezoelectric element due to change in shape and properties of the polymeric piezoelectric element, even in a case in which intense heat is applied to the electrode that is in contact with at least part of a surface of the polymeric piezoelectric element and a surface of the curable resin layer (hereinafter sometimes referred to as "first electrode"), and then the heat is transmitted to the polymeric piezoelectric element.

This eliminates the need for forming an electrode, as an alternative of the first electrode, on a highly heat-resistant film such as a PET film and bonding the film and the polymeric piezoelectric element via a tacky adhesive layer, which can thin the overall device.

This also eliminates the need for, for example, a step of producing a layered body that includes an electrode formed on a highly heat-resistant film such as a PET film and a step of bonding the layered body onto the polymeric piezoelectric element via a tacky adhesive layer, which can simplify a process for producing a pressure-sensing device according to an embodiment of the invention.

As described above, the invention provides a thinner pressure-sensing device produced by a simpler process.

Exemplary aspects of the electrode "that is in contact with at least part of a surface of the polymeric piezoelectric element and a surface of the curable resin layer" include (1) an electrode that is in contact with part or all of a surface of the polymeric piezoelectric element and that is not disposed in contact with a surface of the curable resin layer, (2) an electrode that is in contact with part or all of a surface of the curable resin layer and that is not disposed in contact with a surface of the polymeric piezoelectric element, and (3) an electrode that is in contact with part or all of a surface of the polymeric piezoelectric element and that is in contact with part or all of a surface of the curable resin layer.

A pressure-sensing device 10 according to an embodiment of the invention will be specifically described with reference to the drawings.

FIG. 1 is a cross-sectional view that schematically illustrates a longitudinal cross-section of an exemplary pressure-sensing touch panel that includes a pressure-sensing device according to an embodiment of the invention.

FIGS. 2A-2E are cross-sectional views that schematically illustrate a longitudinal cross-section of an exemplary pressure-sensing component 30 in a pressure-sensing device according to an embodiment of the invention in a pressure-sensing touch panel.

The pressure-sensing device 10 according to an embodiment of the invention includes a pressed component 12 that has a contact surface 12A to which pressure is applied by contact from a presser and a pressure-sensing component 30.

The pressure-sensing component 30 is disposed at an opposite side from the contact surface 12A of the pressed component 12 and includes a polymeric piezoelectric element 20 that has a piezoelectric constant $d_{14}$ of 1 pC/N or more as measured at 25° C. using a stress-charge method; a curable resin layer 18 that includes at least one of a cold-setting resin, a thermosetting resin, or an actinic radiation-curable resin and that is in contact with at least part of a surface of the polymeric piezoelectric element 20; and a pair of first electrodes 16.

In the embodiment, the pressure-sensing device 10 includes, between the pressed component 12 and the pressure-sensing component 30, a position-sensing component 32, which includes highly heat-resistant films 24 such as PET films, electrodes (hereinafter sometimes referred to as "second electrodes") 22 disposed on the films 24, and a tacky adhesive layer 14.

In the embodiment, a tacky adhesive layer 14 is also disposed between the pressed component 12 and the position-sensing component 32, between the position-sensing component 32 and the pressure-sensing component 30, and on the side of the pressure-sensing component 30 opposite to the side on which the pressed component 12 is disposed.

In the embodiment, the first electrodes 16 are connected to a first extraction electrode 26, and the second electrodes 22 are connected to a second extraction electrode 28.

In the embodiment, the polymeric piezoelectric element 20 need only be disposed at an opposite side from the contact surface 12A of the pressed component 12.

More particularly, the polymeric piezoelectric element 20 may be disposed at an opposite side from the contact surface 12A of the pressed component 12, such as in contact with the pressed component 12, or a gap (spacing) or another layer (such as a tacky adhesive layer 14 or a curable resin layer 18) may be present between the polymeric piezoelectric element 20 and the pressed component 12.

More particularly, the pressure-sensing component 30 includes one of the first electrodes 16, the curable resin layer 18, the polymeric piezoelectric element 20, the curable resin layer 18, and the other of the first electrodes 16, starting from the side on which the pressed component 12 is disposed.

The pressure-sensing component 30 need only be configured so that the curable resin layer 18 is in contact with at least part of a surface of the polymeric piezoelectric element 20 and that the first electrodes 16 are disposed in contact with at least part of a surface of the polymeric piezoelectric element 20 and a surface of the curable resin layer 18.

When pressure is applied to the contact surface 12A of the pressed component 12 by contact from a presser, the pressed component 12, the position-sensing component 32, the tacky adhesive layers 14, and the pressure-sensing component 30, including the polymeric piezoelectric element 20, in the pressure-sensing device 10 are deflected together. In response to the deflection, an electrical charge is generated in the polymeric piezoelectric element 20 in the area to which the pressure is applied.

The generated charge is extracted by the first extraction electrode 26 that is electrically connected to an end surface of the first electrode.

Examples of other embodiments of the pressure-sensing component 30 include the following (1)-(5) (see FIGS. 2A-2E).

Figure 2A:
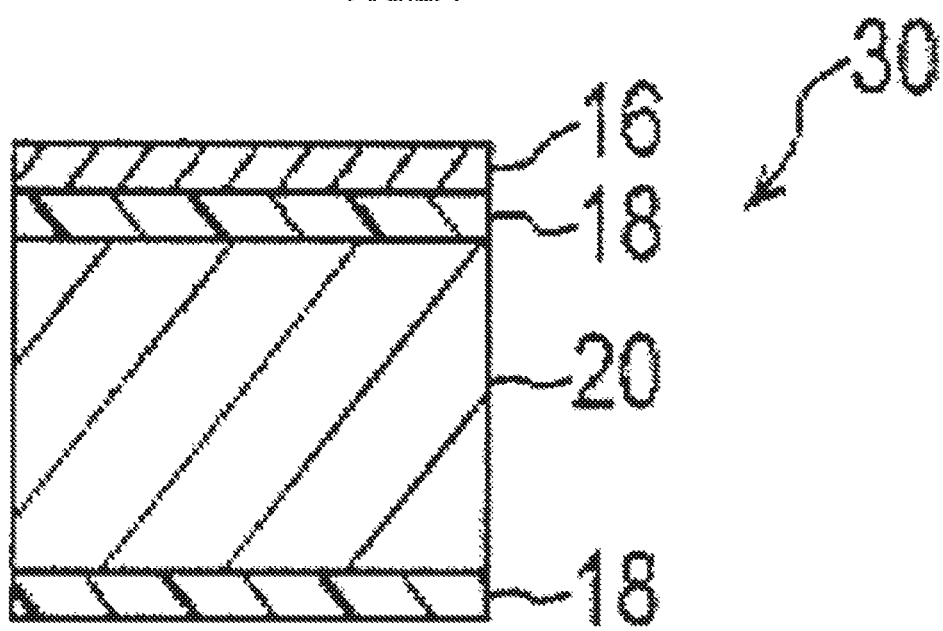
FIG. 2A is a cross-sectional view that schematically illustrates a longitudinal cross-section of another exemplary pressure-sensing component 30 in a pressure-sensing device according to an embodiment of the invention.

(1) A pressure-sensing component 30 that includes the first electrode 16, the curable resin layer 18, the polymeric piezoelectric element 20, and the curable resin layer 18, starting from the side on which the pressed component 12 is disposed (see FIG. 2A)

Figure 2B:
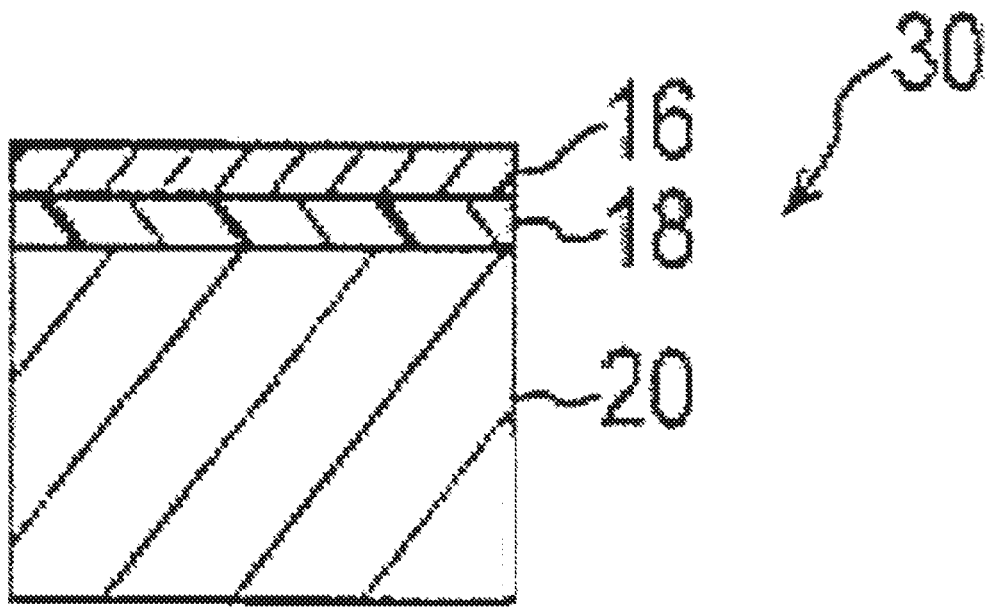
FIG. 2B is a cross-sectional view that schematically illustrates a longitudinal cross-section of another exemplary pressure-sensing component 30 in a pressure-sensing device according to an embodiment of the invention.

(2) A pressure-sensing component 30 that includes the first electrode 16, the curable resin layer 18, and the polymeric piezoelectric element 20, starting from the side on which the pressed component 12 is disposed (see FIG. 2B)

Figure 2C:
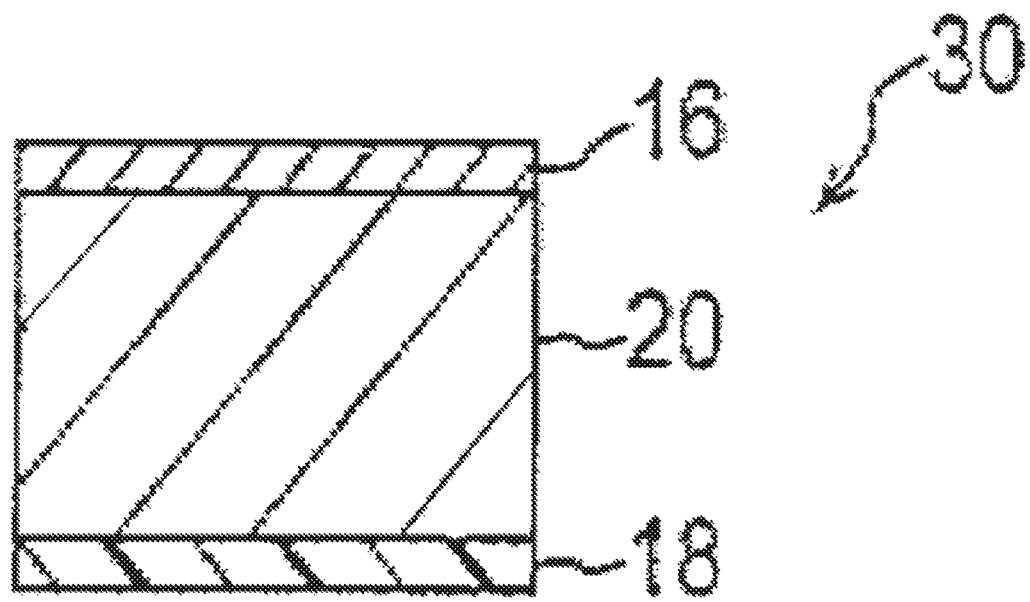
FIG. 2C is a cross-sectional view that schematically illustrates a longitudinal cross-section of another exemplary pressure-sensing component 30 in a pressure-sensing device according to an embodiment of the invention.

(3) A pressure-sensing component 30 that includes the first electrode 16, the polymeric piezoelectric element 20, and the curable resin layer 18, starting from the side on which the pressed component 12 is disposed (see FIG. 2C)

Figure 2D:
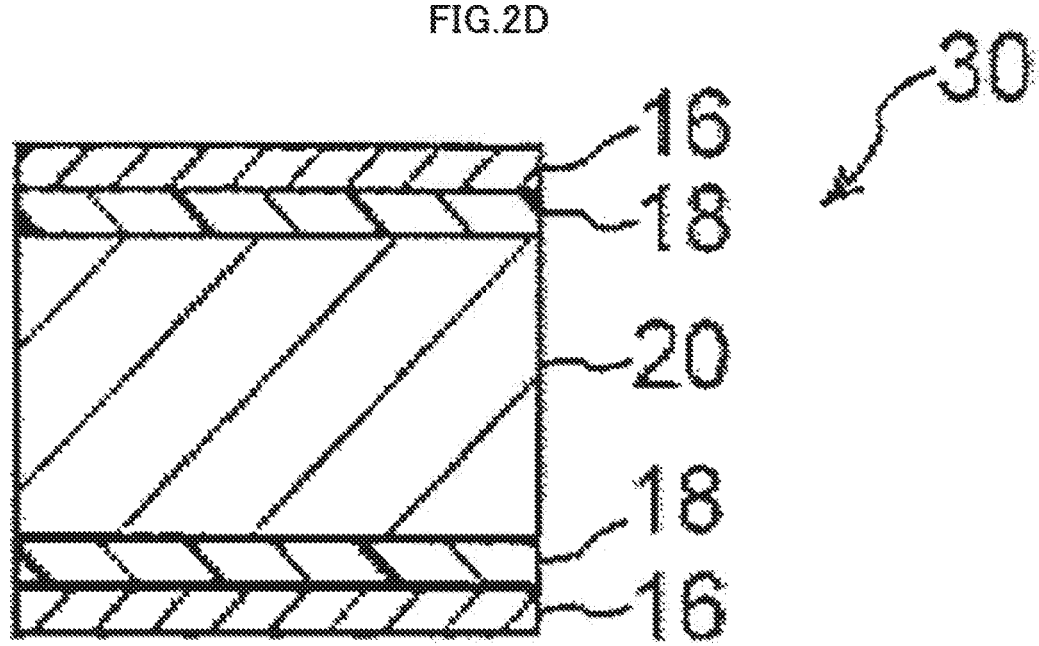
FIG. 2D is a cross-sectional view that schematically illustrates a longitudinal cross-section of another exemplary pressure-sensing component 30 in a pressure-sensing device according to an embodiment of the invention.

(4) A pressure-sensing component 30 that includes one of the first electrodes 16, the curable resin layer 18, the polymeric piezoelectric element 20, the curable resin layer 18, and the other of the first electrodes 16, starting from the side on which the pressed component 12 is disposed (see FIG. 2D)

Figure 2E:
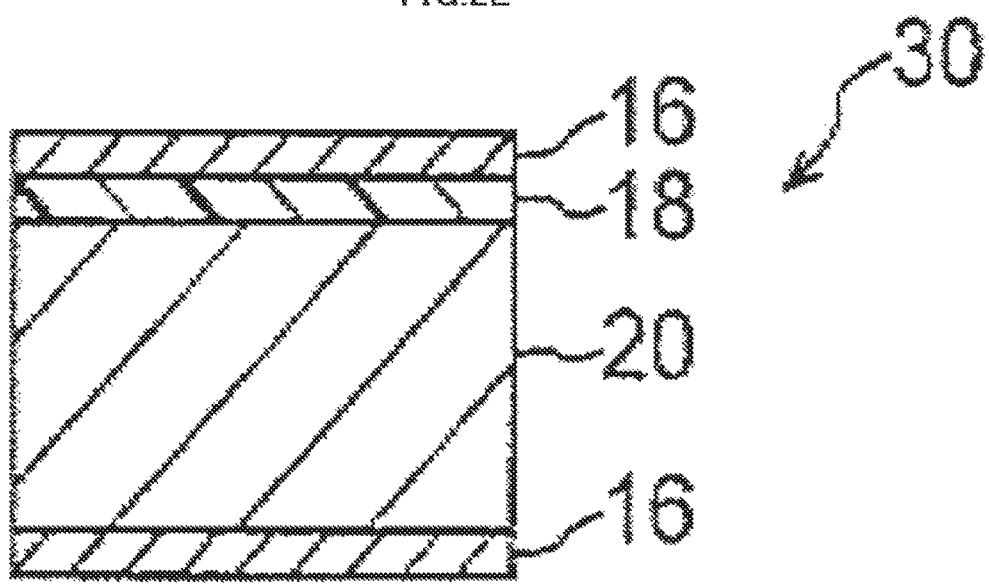
FIG. 2E is a cross-sectional view that schematically illustrates a longitudinal cross-section of another exemplary pressure-sensing component 30 in a pressure-sensing device according to an embodiment of the invention.

(5) A pressure-sensing component 30 that includes one of the first electrodes 16, the curable resin layer 18, the polymeric piezoelectric element 20, and the other of the first electrodes 16, starting from the side on which the pressed component 12 is disposed (see FIG. 2E).

According to an embodiment of the invention, the pressure-sensing device 10 includes a position-sensing component 32.

According to an embodiment of the invention, the position-sensing component 32 is disposed at an opposite side from the contact surface 12A of a pressed component 12, via a tacky adhesive layer 14. More particularly, starting from the tacky adhesive layer 14, the position-sensing component 32 includes a second electrode 22, a highly heat-resistant film 24 such as a PET film, a tacky adhesive layer 14, a second electrode 22, and a highly heat-resistant film 24 such as a PET film.

The second electrodes 22 need only be disposed in contact with the film 24 or the pressed component 12, or may be disposed in contact with the surface opposite from the contact surface 12A of the pressed component 12.

The position-sensing component 32 will be described in more detail below.

Now, individual components of the pressure-sensing device 10 according to an embodiment of the invention will be described in detail.

The reference numbers are omitted in the following description.

<Pressed Component>

In an embodiment of the invention, the pressed component (for example, the above pressed component) has a contact surface to which pressure is applied by contact from a presser such as a finger of an operator.

In an embodiment of the invention, examples of a material of the pressed component include, but not limited to, inorganic materials such as glass and organic materials such as resins (such as acrylic resins, polycarbonate resins, cycloolefin resins, and vinyl chloride resins). (The resins are preferred.)

The pressed component can be an integrated laminate of an inorganic material layer and an organic material layer or a dispersion of an inorganic material in a resin material layer.

In a case in which the pressure-sensing device in an embodiment of the invention is combined with a display device to produce a pressure-sensing touch panel, the pressed component is preferably formed of a highly transparent material in order to enhance visibility of the display device.

The contact surface is to be contacted by a presser such as a finger of an operator. The contact surface may be a surface of the pressed component that is formed as a single layer or may be the outermost layer of the pressed component that is formed of plural layers. For example, a surface of the pressed component may be provided with an electrode and/or a hardcoat layer for enhancing mar resistance. The pressed component may have a gap in part of the interior thereof.

The pressed component preferably has a thickness in the range of from 0.2 mm to 20 mm and more preferably from 0.3 mm to 10 mm in order to reduce distortion of a detected signal.

In a case in which there is a gap between the pressed component and the polymeric piezoelectric element in an embodiment of the invention, the gap preferably has a length of 0.1 mm or less as measured in the direction in which the pressure is applied. In this case, when the pressed component is deflected (displaced) by a presser such as a finger and then becomes in contact with the polymeric piezoelectric element, the deflection of the pressed component is transmitted to the polymeric piezoelectric element, which facilitates the generation of an electrical charge in the polymeric piezoelectric element.

<Polymeric Piezoelectric Element>

The polymeric piezoelectric element in the invention is disposed at an opposite side from the contact surface of the pressed component and has a piezoelectric constant $d_{14}$ of 1 pC/N or more as measured at 25° C. using a stress-charge method.

Now, properties of the polymeric piezoelectric element will be described.

(Properties of Polymeric Piezoelectric Element)
—Piezoelectric Constant $d_{14}$ (by Stress-Charge Method)—

The polymeric piezoelectric element has a piezoelectric constant $d_{14}$ of 1 pC/N or more as measured at 25° C. using a stress-charge method.

The phrase "piezoelectric constant $d_{14}$ as measured at 25° C. using a stress-charge method" is also hereinafter simply referred to as "piezoelectric constant $d_{14}$" or "piezoelectric constant".

Now, an exemplary method for measuring piezoelectric constant $d_{14}$ using a stress-charge method will be described.

First, the polymeric piezoelectric element is cut into a rectangular specimen having a length of 150 mm in the direction of 45° with respect to the stretching direction (MD direction) of the polymeric piezoelectric element and a width of 50 mm in the direction perpendicular to the length. The resultant specimen is placed on the test platform of SIP-600 from Showa Shinku Co., Ltd., and aluminum (hereinafter referred to as Al) is deposited on one surface of the specimen at a thickness of about 50 nm. Al is deposited on the other surface of the specimen in the same manner to provide the specimen having an Al conductive layer on the both surfaces.

The 150 mm by 50 mm specimen having an Al conductive layer on the both surfaces is cut into a rectangular film having a length of 120 mm at an angle of 45° with respect to the stretching direction (MD direction) of the polymeric piezoelectric element and a width of 10 mm perpendicular to the length. The film is used as a sample for measurement of the piezoelectric constant.

The resultant sample is tightly clamped into a tensile tester (TENSILON RTG-1250 from AND Co., Ltd) with an distance between chucks of 70 mm. Then, a force varying in the range of from 4N to 9N is periodically applied at a crosshead speed of 5 mm/min. To measure the amount of charge generated in the sample in response to the applied force, a capacitor having a capacitance of Qm (F) is connected in parallel with the sample, and the voltage V between the terminals of the capacitor Cm (95 nF) is measured via a buffer amplifier. The measurement is taken at a temperature of 25° C. The amount of charge stored on each plate Q(C) is calculated as the product of the capacitance Cm of the capacitor and the voltage Vm between the terminals. The piezoelectric constant $d_{14}$ is calculated with the following formula:

$$d_{14}=(2\times t)/L \times Cm \cdot \Delta Vm/\Delta F$$

t: sample thickness (m)
L: distance between chucks (m)
Cm: capacitance of capacitor connected in parallel (F)
$\Delta Vm/\Delta F$: ratio of change in voltage between the terminals to change in force A higher piezoelectric constant $d_{14}$ leads to a larger displacement of the polymeric piezoelectric element in response to voltage applied to the polymeric piezoelectric element and leads to a higher voltage generated in response to force applied to the polymeric piezoelectric element, which is beneficial for the polymeric piezoelectric element.

More particularly, the polymeric piezoelectric element in the invention preferably has a piezoelectric constant $d_{14}$ of 1 pC/N or more, more preferably 3 pC/N or more, and still more preferably 4 pC/N or more as measured at 25° C. using the stress-charge method. Although the upper limit of the piezoelectric constant $d_{14}$ is not critical, the polymeric piezoelectric element that includes a helical chiral polymer preferably has a piezoelectric constant $d_{14}$ of 50 pC/N or less and more preferably 30 pC/N or less, from the viewpoint of, for example, balance with transparency as described below.

Similarly, the piezoelectric constant $d_{14}$ measured using a resonance method is preferably 15 pC/N or less, from the viewpoint of balance with transparency.

As used herein, "MD direction" refers to a direction in which a film is fed (Machine Direction), and "TD direction" refers to a direction perpendicular to the MD direction and parallel to the principal plane of the film (Transverse Direction).

—Standardized Molecular Orientation Ratio MORc—

The polymeric piezoelectric element of the invention preferably has a standardized molecular orientation MORc of from 2.0 to 10.0.

The polymeric piezoelectric element having a standardized molecular orientation MORc in the range of from 2.0 to 10.0 maintains high film strength and prevents loss of film strength in a particular direction (for example, a direction perpendicular to the primary stretching direction in the plane of the film).

The polymeric piezoelectric element having a MORc in the above range allows many molecules to be aligned with the stretching direction and thus increases the rate of production of oriented crystals. Thus, such polymeric piezoelectric element can exhibit higher piezoelectricity.

Now, the standardized molecular orientation MOR will be described before describing the standardized molecular orientation MORc.

The standardized molecular orientation MOR indicates the degree of molecular orientation and is measured by a microwave measurement method as described below.

More specifically, a sample (film) is placed in a microwave resonant waveguide of a known microwave standardized molecular orientation measuring apparatus (also referred to as "microwave molecular orientation meter") with a surface of the sample (a surface of the film) oriented perpendicular to the direction of travel of the microwave. Then, while the sample is continuously irradiated with the microwave oscillating unevenly in one direction, the sample is rotated from 0° to 360° in the plane perpendicular to the direction of travel of the microwave, and the intensity of the microwave passing through the sample is measured to determine the standardized molecular orientation MOR.

The standardized molecular orientation MORc as described above refers to MOR based on a reference thickness tc of 50 μm and can be determined with the following formula:

$$MORc = (tc/t) \times (MOR-1) + 1$$

(tc: reference thickness for correction, t: sample thickness)

The standardized molecular orientation MORc can be measured at a resonance frequency of about 4 GHz or about 12 GHz using a known molecular orientation meter such as MOA-2012A or MOA-6000 microwave molecular orientation meter from Oji Scientific Instruments Co., Ltd.

The standardized molecular orientation MORc can be controlled by crystallization conditions (for example, heating temperature and heating period) and stretching conditions (for example, stretching temperature and stretching rate) for producing the polymeric piezoelectric element.

The standardized molecular orientation MORc can be converted to birefringence Δn, which is phase difference (retardation) divided by the thickness of a film.

More particularly, the retardation can be measured using RETS 100 from Otsuka Electronics Co., Ltd. The MORc is generally linearly proportional to the Δn, and in a case in which the Δn is 0, the MORc is 1.

For example, in a case in which a polymer (for example, a polymer (A) described below) is a polylactic acid-type polymer, and the birefringence Δn is measured at a wavelength of 550 nm, the preferred lower limit of the standardized molecular orientation MORc of 2.0 can be converted to the birefringence Δn of 0.005. The preferred lower limit of the product of the standardized molecular orientation MORc and the crystallinity of the polymeric piezoelectric element of 40 can be converted to the product of the birefringence Δn and the crystallinity of the polymeric piezoelectric element of 0.1.

—Internal Haze—

The transparency of the polymeric piezoelectric element can be evaluated by, for example, visual observation and measurement of haze.

The polymeric piezoelectric element preferably has an internal haze of 50% or less, as determined using visible light. As used herein, the "internal haze" is measured at 25° C. using a haze meter [TC-HIII DPK from Tokyo Denshoku Co, Ltd.] in accordance with JIS-K7105, for the polymeric piezoelectric element having a thickness of from 0.03 mm to 0.05 mm. A method for measuring the internal haze will be detailed in Examples.

The polymeric piezoelectric element more preferably has an internal haze of 40% or less, still more preferably 20% or less, yet still more preferably 13% or less, and even yet still more preferably 5% or less. From the viewpoint of improving MD tear strength, the polymeric piezoelectric element preferably has an internal haze of 2.0% or less and particularly preferably 1.0% or less.

Although the polymeric piezoelectric element having a lower internal haze is better, the polymeric piezoelectric element preferably has an internal haze of from 0.0% to 40%, more preferably from 0.01% to 20%, still more preferably from 0.01% to 5%, still more preferably from 0.01% to 2.0%, and particularly preferably from 0.01% to 1.0%, from the viewpoint of the balance with, for example, the piezoelectric constant.

As used herein, the "internal haze" of the polymeric piezoelectric element refers to the haze excluding any contribution from an external surface of the polymeric piezoelectric element, as described in Examples below.

—Crystallinity—

The polymeric piezoelectric element of the invention has a crystallinity of from 20% to 80% as obtained by DSC (differential scanning calorimetry).

The polymeric piezoelectric element having a crystallinity of less than 20% would tend to have insufficient strength.

The polymeric piezoelectric element having a crystallinity of more than 80% would tend to have an insufficient transparency (i.e., a high internal haze).

The polymeric piezoelectric element having a crystallinity of from 20% to 80% is also advantageous in increasing the uniformity of the internal haze across a surface.

The polymeric piezoelectric element preferably has a crystallinity of from 30% to 70%.

The polymeric piezoelectric element having a crystallinity of 20% or more is also advantageous in increasing the piezoelectricity (piezoelectric constant) of the polymeric piezoelectric element.

—Product of Standardized Molecular Orientation Ratio MORc and Crystallinity—

The polymeric piezoelectric element preferably has a product of a standardized molecular orientation MORc and a crystallinity of from 25 to 700, more preferably from 75 to 680, still more preferably from 90 to 660, yet still more preferably from 125 to 650, and even yet still more preferably from 180 to 350.

The polymeric piezoelectric element having a product in a range of from 25 to 700 maintains suitable transparency and dimensional stability. Such polymeric piezoelectric element also maintains suitable piezoelectricity.

In the invention, the product of the standardized molecular orientation MORc and the crystallinity of the polymeric piezoelectric element can be controlled within the above range by, for example, adjusting crystallization conditions and stretching conditions in production of the polymeric piezoelectric element.

—Thickness—

The thickness of the polymeric piezoelectric element of the invention is not particularly limited, and for example, the polymeric piezoelectric element can have a thickness of from 10 µm to 1000 µm, preferably from 10 µm to 400 µm, more preferably from 20 µm to 200 µm, still more preferably from 20 µm to 100 µm, and particularly preferably from 30 µm to 80 µm.

The polymeric piezoelectric element of the invention may be a single-layered film or a multi-layered film.

(Component of Polymeric Piezoelectric Element)

Now, components of the polymeric piezoelectric element will be described.

The polymeric piezoelectric element includes a polymer (A) and may optionally include a stabilizer (B) and other components.

—Polymer (A)—

The polymeric piezoelectric element preferably includes the polymer (A) having a repeating unit structure that has one or more functional groups selected from the group consisting of a carbonyl group and an oxy group.

Especially in a case in which the polymeric piezoelectric element includes a highly polar carbonyl group and/or a highly polar oxy group, it is believed that higher electrical polarity is generated in micro-regions of the surface of the polymeric piezoelectric element as described above.

The polymeric piezoelectric element preferably includes, as the polymer (A), an optically-active helical chiral polymer having a weight-average molecular weight of from 50,000 to 1,000,000.

The helical chiral polymer having a weight-average molecular weight of less than 50,000 would provide a polymeric piezoelectric element having an insufficient mechanical strength. The polymeric piezoelectric element preferably has a weight-average molecular weight of 100,000 or more and more preferably 150,000 or more.

The helical chiral polymer having a weight-average molecular weight of more than 1,000,000 would make it difficult to mold the material into the polymeric piezoelectric element (for example, to extrusion-mold the material into, for example, a film shape). The helical chiral polymer preferably has a weight-average molecular weight of 800,000 or less and more preferably 300,000 or less.

In terms of strength of the polymeric piezoelectric element, the helical chiral polymer preferably has a molecular weight distribution (Mw/Mn) of from 1.1 to 5, more preferably from 1.2 to 4, and still more preferably from 1.4 to 3.

The weight-average molecular weight Mw and the molecular weight distribution (Mw/Mn) of the helical chiral polymer are measured using the following gel permeation chromatography (GPC) method and equipment.

—GPC System—

GPC-100 from Waters Corp.

—Column—

SHODEX LF-804 from Showa Denko K.K.

—Preparation of Sample—

The optically active polymer (polymer (A)) is dissolved in a solvent (for example, chloroform) at a concentration of 1 mg/ml at 40° C. to prepare a sample solution.

—Measurement Conditions—

0.1 ml of the sample solution is injected into the column with a solvent (chloroform) at a temperature of 40° C. and a flow rate of 1 ml/min.

The concentration of the sample in the sample solution separated in the column is measured using a differential refractometer. The universal calibration curve is created using polystyrene standards, and the weight-average molecular weight (Mw) and the molecular weight distribution (Mw/Mn) of the polymer (A) are calculated.

Examples of the polymer (A) can include polypeptides, cellulose derivatives, polylactic acid-type resins, polypropylene oxides, and poly(β-hydroxybutyrates).

Examples of the polypeptides include poly(γ-benzyl glutamate) and poly(γ-methyl glutamate).

Examples of the cellulose derivatives include cellulose acetate and cyanoethyl cellulose.

The helical chiral polymer preferably has an optical purity of 95.00% ee or more, more preferably 96.00% ee or more, still more preferably 99.00% ee or more, yet still more preferably 99.99% ee or more, and desirably 100.00% ee.

By using the helical chiral polymer having an optical purity in the above range, crystals of the polymer in the polymeric piezoelectric element are more densely packed. This can result in, for example, further increased piezoelectricity (piezoelectric constant) of the polymeric piezoelectric element.

The optical purity of the helical chiral polymer is calculated with the following formula:

Optical purity (% ee)=100×|Amount of $L$-form– Amount of $D$-form|/(Amount of $L$-form+ Amount of $D$-form)

More particularly, the optical purity is defined as "the difference (absolute value) between the amount [% by mass] of the L-form and the amount [% by mass] of the D-form in the helical chiral polymer" divided by "the total of the amount (% by mass) of the L-form and the amount (% by mass) of the D-form in the helical chiral polymer" multiplied by '100'.

As used herein, the amount [% by mass] of the L-form and the amount [% by mass] of the D-form in the helical chiral polymer are obtained using high performance liquid chromatography (HPLC).

From the viewpoint of increasing the optical purity (and of increasing the piezoelectricity of the polymeric piezoelectric element), the helical chiral polymer preferably has a main chain having a repeating unit represented by the following Formula (1):

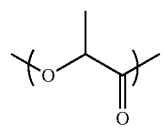

(1)

Examples of the polymer that has a main chain having the repeating unit represented by Formula (1) include polylactic acid-type polymers. Among them, polylactic acids are preferred, and homopolymers of L-lactic acid (PLLA) or homopolymers of D-lactic acid (PDLA) are most preferred. The polylactic acid-type polymers in the embodiment refer to "polylactic acids (polymer compounds consisting of only repeating units derived from monomers selected from L-lactic acid or D-lactic acid)", "copolymers of L-lactic acid or D-lactic acid and a compound copolymerizable with the L-lactic acid or D-lactic acid", or mixtures thereof.

The "polylactic acids" are a long polymer formed by polymerization of lactic acid via ester bonds and is known to be able to be produced, for example, from lactide (a lactide method) or by heating lactic acid in a solvent under reduced pressure and polymerizing the lactic acid while removing water (a direct polymerization method). Examples of the "polylactic acids" include homopolymers of L-lactic acid, homopolymers of D-lactic acid, block copolymers that include at least one of polymerized L-lactic acids or polymerized D-lactic acids, and graft copolymers that include at least one of polymerized L-lactic acids or polymerized D-lactic acids.

Examples of the "compound copolymerizable with L-lactic acid or D-lactic acid" can include hydroxycarboxylic acids such as glycolic acid, dimethyl glycolic acid, 3-hydroxybutyric acid, 4-hydroxybutyric acid, 2-hydroxypropanoic acid, 3-hydroxypropanoic acid, 2-hydroxyvaleric acid, 3-hydroxyvaleric acid, 4-hydroxyvaleric acid, 5-hydroxyvaleric acid, 2-hydroxycaproic acid, 3-hydroxycaproic acid, 4-hydroxycaproic acid, 5-hydroxycaproic acid, 6-hydroxycaproic acid, 6-hydroxymethylcaproic acid, and mandelic acid; cyclic esters such as glycolide, β-methyl-δ-valerolactone, γ-valerolactone, and ε-caprolactone; polycarboxylic acids such as oxalic acid, malonic acid, succinic acid, glutaric acid, adipic acid, pimelic acid, azelaic acid, sebacic acid, undecanedioic acid, dodecanedioic acid, and terephthalic acid and anhydrides thereof; polyhydric alcohols such as ethylene glycol, diethylene glycol, triethylene glycol, 1,2-propanediol, 1,3-propanediol, 1,3-butanediol, 1,4-butanediol, 2,3-butanediol, 1,5-pentanediol, 1,6-hexanediol, 1,9-nonanediol, 3-methyl-1,5-pentanediol, neopentyl glycol, tetramethylene glycol, and 1,4-hexanedimethanol; polysaccharides such as cellulose; and aminocarboxylic acids such as α-amino acid.

Examples of the "copolymers of L-lactic acid or D-lactic acid and a compound copolymerizable with the L-lactic acid or D-lactic acid" include block copolymers and graft copolymers having a polylactic acid sequence that can form helical crystals.

The polymer (A) preferably has a concentration of a structure derived from the copolymerizable component of 20 mol % or less. For example, in a case in which the polymer (A) is a polylactic acid-type polymer, the polymer (A) preferably has a concentration of a structure derived from the compound copolymerizable with the lactic acid (copolymerizable component) of 20 mol % or less with respect to the total number of moles of a structure derived from lactic acid and the structure derived from the copolymerizable component.

The polylactic acid-type polymer can be produced by, for example, direct dehydration-condensation of lactic acid as described in Japanese Patent Application Laid-Open (JP-A) No. S59-096123 and JP-A No. H07-033861 or ring-opening polymerization of lactide, which is the cyclic dimer of lactic acid, as described in, for example, U.S. Pat. No. 2,668,182 and U.S. Pat. No. 4,057,357.

To obtain the polymer having an optical purity of 95.00% ee or more by any of the methods as described above, it is preferred to, for example, polymerize lactide having an increased optical purity of 95.00% ee or more due to crystallization, in a case in which the polylactic acid is produced by the lactide method.

The polylactic acid-type polymer may be a commercially available polylactic acid. Examples of the commercially available polylactic acid include PURASORB (PD and PL) from Purac Biomaterials, LACEA (H-100 and H-400) from Mitsui Chemicals, Inc., and Ingeo™ biopolymers from NatureWorks LLC.

In a case in which the polylactic acid-type polymer is used as the polymer (A), it is preferred to produce the polylactic acid-type polymer by the lactide method or the direct polymerization method in order to obtain the polylactic acid-type polymer having a weight-average molecular weight (Mw) of 50,000 or more.

The polymeric piezoelectric element of the invention preferably includes the polymer (A) (helical chiral polymer) in an amount of 80% by mass or more.

—Stabilizer (B)—

The polymeric piezoelectric element of the invention preferably includes, as a stabilizer, a compound having one or more functional groups selected from the group consisting of a carbodiimide group, an epoxy group, and an isocyanate group and having a weight-average molecular weight of from 200 to 60,000.

The stabilizer (B) is used in order to suppress hydrolysis of the polymer (A) (the hydrolysis is expected to proceed, for example, according to the reaction scheme described below) and improve wet heat resistance of the film.

For the stabilizer, you can see the paragraphs 0039-0055 of WO 2013/054918, if necessary.

—Other Components—

The polymeric piezoelectric element of the invention may include other components such as known resins such as polyvinylidene fluorides, polyethylene resins, and polystyrene resins, inorganic fillers such as silica, hydroxyapatite, and montmorillonite, and known crystal nucleating agents such as phthalocyanine, to the extent that the components do not reduce the benefits of the invention.

For the other components such as inorganic fillers and crystal nucleating agents, you can see the paragraphs 0057-0060 of WO 2013/054918, if necessary.

In a case in which the polymeric piezoelectric element includes a component other than the polymer (A), the polymeric piezoelectric element preferably includes the component other than the polymer (A) in an amount of 20% by mass or less and more preferably 10% by mass or less with respect to the total mass of the polymeric piezoelectric element.

(Method for Producing Polymeric Piezoelectric Element)

A method for producing the polymeric piezoelectric element of the invention is not particularly limited, and, for example, you can see the paragraphs 0065-0099 of WO 2013/054918, if necessary.

More particularly, a preferred method for producing the polymeric piezoelectric element of the invention includes a first step of obtaining a pre-crystallized sheet that includes the polymer (A) and the stabilizer (B), a second step of stretching the pre-crystallized sheet mainly in a uniaxial direction, and optionally, a step of annealing the pre-crystallized sheet.

Another preferred method for producing the polymeric piezoelectric element includes a step of stretching a sheet that includes the polymer (A) and the stabilizer (B) mainly in a uniaxial direction and a step of annealing the sheet, in this order.

<Curable Resin Layer>

The curable resin layer in the invention includes at least one of a cold-setting resin, a thermosetting resin, or an actinic radiation-curable resin and is in contact with at least part of a surface of the polymeric piezoelectric element.

The curable resin layer in the invention acts as a heat-resistant resin layer.

—Materials—

The cold-setting resin and the thermosetting resin may be any resin that is commonly known to cure (be insolubilized) upon heating. The examples include acrylic resins, methacrylic resins, urethane resins, cellulosic resins, vinyl acetate resins, ethylene-vinyl acetate resins, epoxy resins, nylon-epoxy resins, vinyl chloride resins, chloroprene rubber resins, cyanoacrylate resins, silicone resins, modified silicone resins, aqueous polymer-isocyanate resins, styrene-butadiene rubber resins, nitrile rubber resins, acetal resins, phenol resins, polyamide resins, polyimide resins, melamine resins, urea resins, brominated resins, starch resins, polyester resins, and polyolefin resins.

The cold-setting resin and the thermosetting resin preferably includes an epoxy compound that includes at least two epoxy groups in the molecule and a curing agent in order to achieve excellent curability.

Examples of the epoxy compound include glycidyl ethers of bisphenol A, bisphenol S, and bisphenol F, phenol novolac epoxy resins, and biphenyl epoxy compounds.

In the invention, the normal temperature at which the cold-setting resin cures refers to a temperature of from 10° C. to 30° C.

Examples of the actinic radiation-curable resin include resins curable by light radiation as the actinic radiation. For example, UV curable resins, which is curable by UV radiation as the actinic radiation, are preferred.

Specific examples of materials for forming the UV curable resins can include diacrylates such as 1,6-hexanediol diacrylate, 1,4-butanediol diacrylate, ethylene glycol diacrylate, diethylene glycol diacrylate, tetraethylene glycol diacrylate, tripropylene glycol diacrylate, neopentyl glycol diacrylate, 1,4-butanediol dimethacrylate, poly(butanediol) diacrylate, tetraethylene glycol dimethacrylate, 1,3-butylene glycol diacrylate, triethylene glycol diacrylate, triisopropylene glycol diacrylate, polyethylene glycol diacrylate, and bisphenol A dimethacrylate; triacrylates such as trimethylolpropane triacrylate, trimethylolpropane trimethacrylate, pentaerythritol monohydroxy triacrylate, and trimethylolpropane triethoxy triacrylate; tetraacrylates such as pentaerythritol tetraacrylate and di-trimethylolpropane tetraacrylate; and pentaacrylates such as dipentaerythritol (monohydroxy)pentaacrylate.

Multifunctional acrylates that are pentafunctional or higher can also be used as a material for forming the UV curable resins. These multifunctional acrylates may be used singly or in combination of two or more kinds thereof. To these acrylates, one or more of third components such as a photoinitiator, a photosensitizer, a leveling agent, and microparticles or nanoparticles (particles having an average primary particle size of from 1 nm to 100 nm) of a metal oxide or an acrylic component can be added.

Substantially, the nanoparticles may be any nanoparticles as long as the nanoparticles include the same metal and/or metalloid element as the resin component. Suitably, the nanoparticles include a metal oxide or a metal fluoride. Examples of the metal oxide and the metal fluoride that can be suitably used include at least one selected from the group consisting of $Al_2O_3$, $Bi_2O_3$, $CaF_2$, $In_2O_3$, $In_2O_3.SnO_2$, $HfO_2$, $La_2O_3$, $MgF_2$, $Sb_2O_5$, $Sb_2O_5.SnO_2$, $SiO_2$, $SnO_2$, $TiO_2$, $Y_2O_3$, $ZnO$, and $ZrO_2$. Especially, $Al_2O_3$, $SiO_2$, and $TiO_2$ can be suitably used.

Preferably, the curable resin layer includes a carbonyl group and includes a three-dimensional cross-linked structure in order to suppress the dimensional change in the polymeric piezoelectric element due to change in shape and properties of the polymeric piezoelectric element.

The curable resin layer that includes a carbonyl group has excellent adhesion to the polymeric piezoelectric element.

The curable resin layer that includes a three-dimensional cross-linked structure can have further improved adhesion to the polymeric piezoelectric element and improved solvent resistance.

An exemplary method for forming the curable resin layer that includes a carbonyl group and a polymer is to polymerize a composition that includes a compound having a carbonyl group with a functional compound having a reactive group. The compound having a carbonyl group and the functional compound may be the same or different.

In a case in which the compound having a carbonyl group and the functional compound are the same, the reactive group itself in the functional compound may include a carbonyl group, or a moiety other than the reactive group in the functional compound may include a carbonyl group. In a case in which the compound having a carbonyl group and the functional compound are different, the compound having a carbonyl group has one or more reactive groups that can react with the functional compound.

In the polymerization, identical types of reactive groups may be reacted, or two or more different types of reactive groups may be reacted. In the case of reaction between two or more different types of reactive groups, the two or more types of reactive groups may be included in the same compound, or a functional compound having two or more identical reactive groups and a functional compound having two other reactive groups that are different from the above reactive groups and that can be reacted with the above reactive groups.

In a case in which identical types of reactive groups (hereinafter simply referred to as "identical reactive groups") may be reacted, examples of the identical reactive groups include an acrylic group, a methacryl group, a vinyl group, an allyl group, an isocyanate group, and an epoxy group. An acrylic group, a methacryl group, and an isocyanate group include a carbonyl group in its reactive group. In a case in which a vinyl group, an allyl group, or an epoxy group is used, a compound that has a carbonyl group in a moiety other than the reactive group can be used.

In order to provide a three-dimensional cross-linked structure to the polymer, a difunctional or higher compound is at least partially included in the composition so that the identical reactive groups can form a three-dimensional cross-linked structure.

In a case in which two or more different types of reactive groups (hereinafter also simply referred to as "different reactive group") are reacted, examples of the different reactive groups include combinations of an epoxy group and carboxyl group, an epoxy group and an amino group, an epoxy group and a hydroxyl group, an epoxy group and an acid anhydride group, an epoxy group and a hydrazide group, an epoxy group and a thiol group, an epoxy group and an imidazole group, an epoxy group and an isocyanate group, an isocyanate group and a carboxyl group, an isocyanate group and an amino group, an isocyanate group and a hydroxyl group, a carbodiimide group and an amino group, a carbodiimide group and a carboxyl group, an oxazolino group and a carboxyl group, and a hydrazide group and a carboxyl group.

In order to provide a three-dimensional cross-linked structure to the polymer, a trifunctional or higher compound is at least partially included in the composition so that one or both of the different reactive groups can form a three-dimensional cross-linked structure.

Among them, a carboxyl group, an acid anhydride group, a hydrazide group, and an isocyanate group have a carbonyl group in its reactive group. In a case in which other reactive groups are used, a compound that has a carbonyl group in a moiety other than the reactive group can be used.

Examples of functional compounds that have an epoxy group and a carbonyl group in the same molecule include epoxy acrylate.

Examples of functional compounds that have a hydroxyl group and a carbonyl group in the same molecule include polyester polyols, polyurethane polyols, acrylic polyols, polycarbonate polyols, and partially carboxymethylated cellulose.

Examples of functional compounds that have an amino group and a carbonyl group in the same molecule include amine-terminated polyamides, amine-terminated polyimides, and amine-terminated polyurethanes.

Among them, polymers of compounds having a (meth) acrylic group are more preferred in the invention.

The term "(meth)acrylic" means that at least one of acrylic or methacryl is included.

—Formation Method—

The curable resin layer can be formed by any appropriate known method that is conventionally generally used. Examples of the method include wet coating. For example, the curable resin layer is formed by applying a coating solution having a material for forming the curable resin layer (a polymerizable compound or polymerized polymerizable compound) dispersed or dissolved therein and drying the solution, if necessary. The polymerizable compound may be polymerized before or after application of the solution.

In the above polymerization process, if necessary, the material (polymerizable compound) may be exposed to heat or actinic radiation (such as UV, electron, or ionizing radiation) to cure the curable resin layer. The material can impart increased crosslink density by reducing the equivalent weight of the reactive groups in the material for forming the curable resin layer (polymerizable compound) (i.e., increasing the number of reactive groups per unit molecular weight of the polymerizable compound), thereby further improving adhesion to the polymeric piezoelectric element.

Among the above polymers, actinic radiation-curable resins cured by exposure to actinic radiation (such as UV, electron, or ionizing radiation) are preferred. The curable resin layer that includes an actinic radiation-curable resin allows for improved production efficiency and further improved adhesion to the polymeric piezoelectric element.

—Surface Treatment—

A surface of the polymeric piezoelectric element can be subjected to treatment such as corona treatment, ITRO treatment, ozone treatment, or plasma treatment in order to further improve adhesion between the surface of the polymeric piezoelectric element and the curable resin layer and to improve applicability of the curable resin layer to the surface of the polymeric piezoelectric element.

Thickness d

The thickness (average thickness) d of the curable resin layer is not particularly limited and is preferably in the range of from 0.01 μm to 10 μm.

The curable resin layer having a thickness d that is equal to or more than the above lower limit, for example, serves the function of, for example, a hardcoat layer described below.

The upper limit of the thickness d is preferably 6 μm or less and more preferably 3 μm or less. The lower limit is preferably 0.2 μm or more and more preferably 0.3 μm or more.

The curable resin layer may be disposed on the both surfaces of the polymeric piezoelectric element. In this case, the thickness d refers to the total thickness of the both layers.

The thickness d of the curable resin layer is determined with the following formula using DIGIMICRO STAND MS-11C digital length gauge system from Nikon Corp.

$$d = dt - dp \quad \text{Formula:}$$

dt: average of ten thickness measurements of layered body of polymeric piezoelectric element and curable resin layer dp: average of ten thickness measurements of polymeric piezoelectric element before formation of curable resin layer or after removal of curable resin layer —Dielectric Constant—

The curable resin layer preferably has a dielectric constant of 1.5 or more, more preferably from 2.0 to 20000, and still more preferably from 2.5 to 10000.

In a case in which an electrode is additionally disposed on the curable resin layer of the layered body, the curable resin layer having a dielectric constant in the above range allows for generation of a high electrical charge in the electrode.

The dielectric constant of the curable resin layer is measured in the following manner.

The curable resin layer is formed on one side of the polymeric piezoelectric element, and then about 50 nm of Al is deposited on the both surfaces of the layered body using SIP-600 from Showa Shinku Co., Ltd. The layered body is cut into a film having a size of 50 mm by 50 mm. The resultant specimen is connected to LCR METER 4284A from Hewlett Packard Co., and the capacitance C is measured. Then the dielectric constant εc of the curable resin layer is calculated with the following formula:

$$\varepsilon c = (C \times dc \times 2.7) / (\varepsilon 0 \times 2.7 \times S - C \times dp)$$

dc: thickness of curable resin layer, ε0: vacuum permittivity, S: area of specimen, dp: thickness of polymeric piezoelectric element —Internal Haze of Curable Resin Layer—

The curable resin layer preferably has an internal haze of 10% or less, more preferably from 0.0% to 5%, and still more preferably from 0.01% to 2%.

The curable resin layer having an internal haze in the above range is highly transparent and can be effectively used in, for example, a pressure-sensing touch panel.

The internal haze Hc of the curable resin layer is calculated with the following formula:

$$Hc = H - Hp$$

H: internal haze of layered body of polymeric piezoelectric element and curable resin layer Hp: internal haze of polymeric piezoelectric element before formation of curable resin layer or after removal of curable resin layer As used herein, the internal haze of the polymeric piezoelectric element is measured at 25° C. for the polymeric piezoelectric element having a thickness of from 0.03 mm to 0.05 mm using a haze meter [Tokyo Denshoku Co, Ltd., TC-HIII DPK] in accordance with JIS-K7105. The measurement method is described in detail in Examples.

The internal haze of the layered body is measured in a manner similar to that described for the internal haze of the polymeric piezoelectric element.

<Electrode>

(First Electrode)

The first electrode in the invention is in contact with at least part of a surface of the polymeric piezoelectric element and a surface of the curable resin layer.

Preferably, the electrode is shaped so that the electrode has a large area of contact with at least part of the surface of the polymeric piezoelectric element and the surface of the curable resin layer, in order to facilitate the transmission of pressure applied by a presser.

Examples of materials of the first electrode include, but not limited to, Al, Ag, Au, Cu, Ag—Pd alloys, Ag paste, carbon blacks, ITO (crystalline ITO and amorphous ITO), ZnO, IGZO, IZO®, electrically conductive polymers (polythiophenes, PEDOT), Ag nanowires, carbon nanotubes, and graphenes.

A method for forming the electrode depends on the material, and the examples include sputtering, deposition, and application.

(Second Electrode)

In a case in which the pressure-sensing device in the invention includes a position-sensing component, the position-sensing component may include a second electrode.

Examples of the material of the second electrode and the method for forming the second electrode include those described for the first electrode.

(Extraction Electrode)

Preferably, the first electrode and the second electrode in the invention have an extraction electrode that is electrically connected thereto.

Examples of the material of the extraction electrode and the method for forming the extraction electrode include those described for the first electrode.

Examples of the extraction electrode include FPC (flexible printed circuit boards).

Examples of connection of the extraction electrode include connection of the electrode to an end surface of an electrode such as the first electrode or the second electrode using, for example, an ACF (anisotropic conductive film), ACP (anisotropic conductive paste), or solder.

In this case, when the extraction electrode is connected to the first electrode or the second electrode, the first electrode or the second electrode is heated to high temperature, and an element around the electrode is also expected to be heated to high temperature. In the invention, the curable resin layer is in contact with at least part of a surface of the polymeric piezoelectric element, and thus the dimensional change in the polymeric piezoelectric element can be reduced, even when the polymeric piezoelectric element exhibits a change in properties and shape upon heating.

<Position-Sensing Component>

The pressure-sensing device in the invention may include a position-sensing component.

In a case in which X is a particular direction on the principal plane (contact surface) of the pressed component, and Y is a direction that is perpendicular to X on the principal plane of the pressed component, the position-sensing component in the invention senses a position in X and Y directions. The position-sensing component in the invention can be any known sensor that is used for sensing such position.

Examples of the sensor include resistive sensors, capacitance sensors, surface acoustic wave sensors, infrared sensors, and optical sensors.

The position-sensing component may be disposed, for example, on the press surface side of the pressed component, between the pressed component and the polymeric piezoelectric element, or on the side of the polymeric piezoelectric element opposite to the side on which the pressed component is disposed. The resistive position-sensing component is preferably disposed between the pressed component and the polymeric piezoelectric element or on the side of the polymeric piezoelectric element opposite to the side on which the pressed component is disposed. The capacitance position-sensing component is preferably disposed between the pressed component and the polymeric piezoelectric element. The surface acoustic wave, infrared, or optical position-sensing component is preferably disposed on the press surface side of the pressed component. The position-sensing component may be integrated into the pressed component.

Examples of the capacitance sensor include in-cell sensors, on-cell sensors, film sensors, sensors integral with a cover glass, and film-glass composite sensors, depending on the positions of the electrodes. Among them, the film sensors, the sensors integral with a cover glass, and the film-glass composite sensors are desired, as the pressure-sensing electrode does not affect position-sensing by the position-sensing electrode.

For example, a touch sensor described in WO 2013/089048 is suitable as the position-sensing component.

In the invention, the position-sensing component includes, for example, an electrode and a substrate (such as a highly heat-resistant film such as a PET film or a glass plate) that is provided with the electrode.

In addition to PET, examples of the materials of the highly heat-resistant film include polycarbonate (PC), polyvinyl alcohol (PVA), cycloolefin polymers (COP), polymethyl methacrylate (PMMA), triacetyl cellulose (TAC), and polyimides (PI). Depending on the application, the film may be a zero retardation film having a very low in-plane retardation (not more than tens of nanometers) or an ultrahigh retardation film having a very high in-plane retardation (not less than thousands of nanometers).

<Tacky Adhesive Layer>

The tacky adhesive layer in the invention has tackiness and adhesiveness. The tacky adhesive layer can be disposed between respective components of the pressure-sensing device.

In the pressure-sensing device in the invention, for example, the tacky adhesive layer is preferably disposed between the pressed component and the polymeric piezoelectric element. In a case in which the position-sensing component is disposed, the tacky adhesive layer is preferably disposed between the position-sensing component and the polymeric piezoelectric element.

The tacky adhesive layer can be a double-sided adhesive tape (OCA; Optical Clear Adhesive) formed by applying an adhesive layer to the both sides of a separator.

The tacky adhesive layer can also be formed using, for example, a tacky adhesive coating solution such as a solvent solution, a solvent-free solution, or an aqueous solution, a UV curable OCR (optical clear resin), or a hot-melt adhesive.

Examples of the OCA include Optically Clear Adhesive Tape LUCIACS Series (from Nitto Denko Corp.), High Transparent Double-Faced Tape 5400A Series (from Sekisui Chemical Co., Ltd.), Optically Clear Adhesive Sheet Opteria Series (from Lintec Corp.), highly transparent adhesive transfer tape series (from Sumitomo 3M Ltd.), and SANCUARY Series (from Sun A. Kaken Co., Ltd.).

Examples of the adhesive coating solution include SK-DYNE Series (from Soken Chemical & Engineering Co., Ltd.), FINETACK Series (from DIC Corp.), VONCOAT Series, LKG Series (from Fujikura Kasei Co., Ltd.), and COPONYL Series (from The Nippon Synthetic Chemical Industry Co., Ltd.).

In order to prevent heating of the polymeric piezoelectric element, the tacky adhesive layer is preferably formed by using an OCA, using an OCR, applying a tacky adhesive coating solution to an element other than the polymeric piezoelectric element, or applying a hot-melt adhesive to an element other than the polymeric piezoelectric element.

The materials of the tacky adhesive layer are not particularly limited, and the tacky adhesive layer preferably includes a resin.

Examples of the resin include acrylic resins, methacrylic resins, urethane resins, cellulosic resins, vinyl acetate resins, ethylene-vinyl acetate resins, epoxy resins, nylon-epoxy resins, vinyl chloride resins, chloroprene rubber resins, cyanoacrylate resins, silicone resins, modified silicone resins, aqueous polymer-isocyanate resins, styrene-butadiene rubber resins, nitrile rubber resins, acetal resins, phenol resins, polyamide resins, polyimide resins, melamine resins, urea resins, brominated resins, starch resins, polyester resins, and polyolefin resin.

<Other Components>

The pressure-sensing touch panel in the invention may include a component that has a known function, to the extent that the component does not reduce the benefits of the invention. The component may be a single functional layer or a functional layer formed on a substrate such as a film. Examples of the functional layer include a polarizing layer, a retardation layer, an anti-splinter layer, an anti-reflective layer, an anti-glare layer, an anti-Newton Ring layer, a gas barrier layers, a hardcoat layer, an anti-fingerprint layer, a refractive index modifying layer, a lubricating layer, an anti-blocking layer, a protective layer, an antistatic layer, a heat dissipation layer, and a UV absorbing layer.

[Pressure-Sensing Touch Panel]

The pressure-sensing device in the embodiment can be combined with a display device to produce a pressure-sensing touch panel. In this case, the first electrode and the second electrode are preferably a transparent electrode. More particularly, the transparent electrode refers to an electrode having an internal haze of 20% or less (a total light transmittance of 80% or more).

Examples of the display device that can be used include liquid crystal panels and organic EL panels.

EXAMPLES

Now, the embodiments of the invention will be described more specifically with reference to examples, but the embodiments of the invention are not limited to the examples without departing from the spirit of the invention.

<Production of Polymeric Piezoelectric Element (Polylactic Acid Film: PLA Film)>

A polylactic acid-type polymer from NatureWorks LLC (trade name: Ingeo™ biopolymer, model number: 4032D, weight-average molecular weight Mw: 200,000, melting point (Tm): 166° C., glass transition temperature (Tg): 57-60° C.) as the polymer (A) was prepared as a raw material.

The prepared material was fed into a hopper of an extruder. The material was extruded from a T die, while the material is heated to a temperature of from 220° C. to 230° C. The extrudate was contacted with a casting roll at 55° C. for 0.5 minutes to give a pre-crystallized sheet having a thickness of 150 μm (pre-crystallization step). The crystallinity of the pre-crystallized sheet was measured to be 5.63%.

While the resultant pre-crystallized sheet was heated to 70° C., the film was uniaxially stretched at a stretching rate of 1650 mm/min and a draw rate of 3.3 times in the MD direction in a roll-to-roll system (stretching step). The resultant film had a thickness of 0.05 mm (50 μm).

In a roll-to-roll system, the uniaxially stretched film was annealed by passing the film over a heated roll at 130° C. over a period of 60 seconds to produce the polymeric piezoelectric element (annealing step).

[Measurement of Physical Properties]

For the polymeric piezoelectric element obtained as described above, the weight-average molecular weight (Mw) and the molecular weight distribution (Mw/Mn) of the optically active polymer and the melting point (Tm), the crystallinity, the internal haze, the MORc, the piezoelectric constant $d_{14}$, and the product of the standardized molecular orientation MORc and the crystallinity of the polymeric piezoelectric element were measured. The results are illustrated in Table 1.

More particularly, the properties were measured in the following manner.

(Molecular Weight Distribution (Mw/Mn) and Weight-Average Molecular Weight of Optically Active Polymer)

The molecular weight distribution (Mw/Mn) and the weight-average molecular weight (Mw) of the resin (optically active polymer) included in the polymeric piezoelectric element were determined using the GPC method described above.

(Melting Point and Crystallinity)

10 mg of the polymeric piezoelectric element was precisely weighed. And a melting endotherm curve was obtained by heating the element to 140° C. at a temperature increase rate of 500° C./min and heating the element to 200° C. at a temperature increase rate of 10° C./min using a differential scanning calorimeter (DSC-1 from PerkinElmer, Inc.). From the melting endotherm curve, the melting point Tm and the crystallinity were determined.

(Internal Haze)

As used herein, "internal haze" refers to the internal haze of the polymeric piezoelectric element and is measured by a common method.

More particularly, the internal haze of the polymeric piezoelectric element in the examples was determined by measuring the transmission of light incident in the thickness direction under the following measurement conditions using the following equipment. More particularly, a pair of glass plates having only silicone oil (SHIN-ETSU SILICONE® from Shin-Etsu Chemical Co., Ltd., product number: KF96-100CS) disposed therebetween was measured for haze (H2), and then the polymeric piezoelectric element that has surfaces uniformly wetted with the silicone oil and that is sandwiched between two glass plates was measured for haze (H3). Then the difference between the hazes was calculated with the following formula to determine the internal haze (H1) of the polymeric piezoelectric element of the examples.

Internal Haze (H1)=Haze (H3)−Haze (H2)

The haze (H2) and the haze (H3) were determined by measuring the transmission of light incident in the thickness direction under the following measurement conditions using the following equipment:

Measurement Device: HAZE METER TC-HIII DPK from Tokyo Denshoku Co., Ltd.

Sample Size: width of 3 mm, length of 30 mm, thickness of 0.05 mm

Measurement Conditions: conditions in accordance with JIS-K7105

Measurement Temperature: room temperature (25° C.)

(Standardized Molecular Orientation Ratio MORc)

The standardized molecular orientation MORc was measured using MOA-6000 microwave molecular orientation meter from Oji Scientific Instruments Co., Ltd. The reference thickness tc was 50 μm.

(Piezoelectric Constant $d_{14}$)

The piezoelectric constant $d_{14}$ of the polymeric piezoelectric element was measured by the stress-charge method described above.

(Product of Standardized Molecular Orientation Ratio MORc and Crystallinity)

The product of the standardized molecular orientation MORc and the crystallinity of the polymeric piezoelectric element was calculated.

TABLE 1

| Polymer (A) | | | | Properties of Polymeric Piezoelectric Element | | | | | | |
|---|---|---|---|---|---|---|---|---|---|---|
| Resin | Chirality | Mw | Mw/Mn | Optical Purity (% ee) | Tm (° C.) | Crystallinity (%) | MORc @50 μm | MORc × Crystallinity | Internal Haze (%) | Piezoelectric Constant (pC/N) |
| LA | L | 200 thousand | 1.83 | 97.0 | 164.6 | 39.8 | 4.73 | 188 | 0.0 | 6.2 |

Example 1

<Production of Curable Resin Layer>

The coating solution for forming a curable resin layer was an acrylic hard coat solution (PELTRON A2002 from Pelnox Ltd.).

The prepared polymeric piezoelectric element (PLA film) was cut into a PLA film having a width of 100 mm and a length of 100 mm. The coating solution for forming the curable resin layer was applied to all of a larger surface of the resultant PLA film with an applicator and dried at 60° C. for 5 minutes. Then the surface was irradiated with UV rays at a total dose of 1000 mJ/cm$^2$ using a metal halide lamp to form the curable resin layer. The curable resin layer had a thickness of 2 μm.

Then, another curable resin layer is similarly formed on a surface opposite side from the surface having the curable resin layer formed thereon to provide a PLA film having the curable resin layer formed on both surfaces thereof.

<Evaluation>

(Dimensional Change)

The resultant PLA films having curable resin layers formed thereon were heated at a temperature of 100° C., 125° C., 150° C., or 160° C. for 30 minutes using a constant temperature bath (DN64 from Yamato Scientific Co., Ltd.).

After heating, the respective PLA films having curable resin layers formed thereon were measured for dimensional change in the following manner. A film exhibiting a smaller dimensional change has a higher dimensional stability. The results are illustrated in Table 2 below and FIG. 3.

Dimensional Change (%)=100×((Length of Side in MD Direction of PLA Film prior to Heating)−(Length of Side in MD direction of PLA film after Heating))/(Length of Side in MD Direction of PLA Film prior to Heating)

Comparative Example 1

The same PLA films (PLA films having no curable resin layers formed thereon) as in Example 1 was used to evaluate dimensional change in the same manner as in Example 1. The results are illustrated in Table 2 below and FIG. 3.

TABLE 2

| | Dimensional Change (%) | | | |
|---|---|---|---|---|
| | 100° C. | 125° C. | 150° C. | 160° C. |
| Example 1 | 0.59 | 0.81 | 1.11 | 1.71 |
| Comparative Example 1 | 0.12 | 1.57 | 7.83 | 20.18 |

Figure 3:
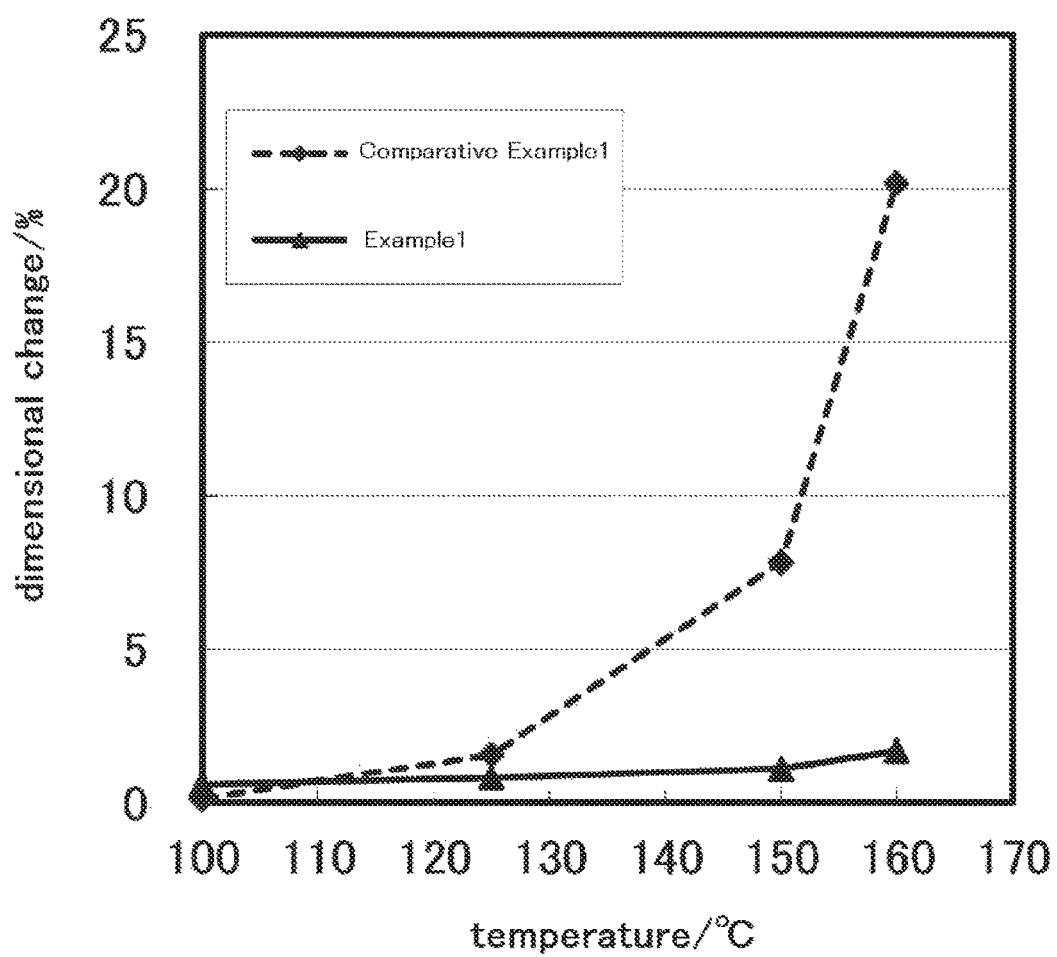
FIG. 3 illustrates results of evaluation of dimensional change in examples of the invention.

It is clear from the results illustrated in Table 2 and FIG. 3 that the polymeric piezoelectric elements having the curable resin layers thereon of Example 1 exhibited a smaller dimensional change, compared with the polymeric piezoelectric elements having no curable resin layers of Comparative Example 1.

Thus, it is evident that a pressure-sensing device that includes the polymeric piezoelectric element having curable resin layers thereon in the embodiments eliminates the need for a step of forming a layered body of a film such as a PET film and the first electrode and thus simplifies the process for producing the pressure-sensing device.

It is also evident that a pressure-sensing device that includes the polymeric piezoelectric element having curable resin layers thereon in the embodiments does not need a film such as a PET film and thus becomes thinner.

Example 2

An ITO layer (having a thickness of 100 nm) as an electrode was formed, by sputtering, on one surface of the PLA film having the curable resin layers thereon produced in Example 1 to produce a layered body.

Comparative Example 2

An ITO layer (having a thickness of 100 nm) as an electrode was formed, by sputtering, on one surface of the PLA film having no curable resin layers thereon produced in Comparative Example 1 to produce a layered body.

(Surface Resistance)

The layered bodies obtained in Example 2 and Comparative Example 2 were measured for initial surface resistance immediately after formation of the ITO layer and surface resistance after heating at 150° C. for 30 minutes. These surface resistance values were measured using LORESTA GP MCP-T610 surface resistance meter from Mitsubishi Chemical Analytech Co., Ltd.

The layered bodies obtained in Example 2 and Comparative Example 2 were evaluated for dimensional change at 150° C. and other physical properties in the same manner as in Example 1 and Comparative Example 1.

The results are illustrated in Table 3 below.

TABLE 3

|  | Tm (° C.) | Crystallinity (%) | MORc @50 μm | MORc × Crystallinity | Internal Haze (%) | Piezoelectric Constant (pC/N) | Dimensional Change at 150° C. (%) | Initial Surface Resistance (Ω/sq) | Surface Resistance after Heating (Ω/sq) |
| --- | --- | --- | --- | --- | --- | --- | --- | --- | --- |
| Example 2 | 165.1 | 38.3 | 4.64 | 178 | 0.1 | 6.0 | 1.06 | 115 | 88 |
| Comparative Example 2 | 164.3 | 37.6 | 4.71 | 177 | 0.2 | 6.1 | 18.31 | 128 | 10128 |

It is clear from the results illustrated in Table 3 that the layered body of the polymeric piezoelectric element (having curable resin layers thereon) obtained in Example 2 exhibited a smaller dimensional change at 150° C., compared with the layered body of the polymeric piezoelectric element (having no curable resin layers thereon) obtained in Comparative Example 2.

In Example 2, there was little difference between the initial surface resistance and the surface resistance after heating, while in Comparative Example 2, there was a large difference between the initial surface resistance and the surface resistance after heating. It is believed that the layered body in Comparative Example 2 exhibited significantly increased surface resistance after heating, because the polymeric piezoelectric material was significantly deformed and then the ITO layer was damaged.

The disclosure of Japanese Patent Application No. 2013-210346 filed on Oct. 7, 2013 is herein incorporated by reference in its entireties.

All publications, patent applications, and technical specifications described herein are herein incorporated by reference as if each individual publication, patent application, or technical specification were specifically and individually indicated to be incorporated by reference.

DESCRIPTION OF THE REFERENCE NUMERAL 10 pressure-sensing device
12 pressed component
12A contact surface
14 tacky adhesive layer
16 first electrode
18 curable resin layer
20 polymeric piezoelectric element
22 second electrode
24 film (highly heat-resistant film such as PET film)
26 first extraction electrode
28 second extraction electrode
30 pressure-sensing component
32 position-sensing component

The invention claimed is:

1. A pressure-sensing device comprising
a pressed component that has a contact surface to which pressure is applied by contact from a presser;
a polymeric piezoelectric element that is disposed at an opposite side from the contact surface of the pressed component and that has a piezoelectric constant $d_{14}$ of 1 pC/N or more, as measured at 25° C. using a stress-charge method;
a curable resin layer that comprises at least one selected from the group consisting of cold-setting resins, thermosetting resins and actinic radiation-curable resins, and that is in contact with at least part of a surface of a side facing the pressed component of the polymeric piezoelectric element or at least part of a surface of an opposite side facing the pressed component of the polymeric piezoelectric element; and
an electrode that is in contact with at least part of a surface of the polymeric piezoelectric element or of a surface of the curable resin layer.

2. The pressure-sensing device according to claim 1, wherein the curable resin layer comprises a carbonyl group and comprises a three-dimensional cross-linked structure.

3. The pressure-sensing device according to claim 1, wherein the device comprises a position-sensing component that is disposed on a press surface side of the pressed component, between the pressed component and the polymeric piezoelectric element, or on a side of the polymeric piezoelectric element opposite to the side on which the pressed component is disposed.

4. The pressure-sensing device according to claim 3, wherein a tacky adhesive layer is disposed between the position-sensing component and the polymeric piezoelectric element.

5. The pressure-sensing device according to claim 1, wherein a tacky adhesive layer is disposed between the pressed component and the polymeric piezoelectric element.

6. The pressure-sensing device according to claim 1, wherein the polymeric piezoelectric element comprises a repeating unit structure that has at least one functional group selected from the group consisting of a carbonyl group and an oxy group.

7. The pressure-sensing device according to claim 1, wherein the polymeric piezoelectric element comprises an optically-active helical chiral polymer having a weight-average molecular weight of from 50,000 to 1,000,000, and has a standardized molecular orientation MORc of from 2.0 to 10.0 as measured based on a reference thickness of 50 μm using a microwave transmission-type molecular orientation meter, an internal haze of 50% or less as determined using visible light, and a product of a standardized molecular orientation MORc and a crystallinity measured by DSC of from 25 to 700.

8. The pressure-sensing device according to claim 7, wherein the internal haze is 5% or less.

9. The pressure-sensing device according to claim 7, wherein the internal haze is 2.0% or less.

10. The pressure-sensing device according to claim 7, wherein the internal haze is 1.0% or less.

11. The pressure-sensing device according to claim 7, wherein the helical chiral polymer is a polylactic acid-type polymer that has a main chain having a repeating unit represented by the following Formula (1):

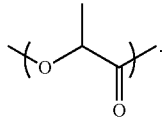

12. The pressure-sensing device according to claim 7, wherein the helical chiral polymer has an optical purity of 95.00% ee or more.

13. The pressure-sensing device according to claim 7, wherein the polymeric piezoelectric element comprises the helical chiral polymer in an amount of 80% by mass or more.

14. The pressure-sensing device according to claim 1, wherein the device further comprises an extraction electrode that is electrically connected to the electrode.

15. A pressure-sensing touch panel comprising the pressure-sensing device according to claim 1 and a display device.

16. The pressure-sensing device according to claim 1, wherein the curable resin layer has a thickness of from 0.01 µm to 10 µm.

17. The pressure-sensing device according to claim 1, wherein the curable resin layer comprises at least one selected from the group consisting of acrylic resins, methacrylic resins, urethane resins, cellulosic resins, vinyl acetate resins, ethylene-vinyl acetate resins, epoxy resins, nylon-epoxy resins, vinyl chloride resins, chloroprene rubber resins, cyanoacrylate resins, silicone resins, modified silicone resins, aqueous polymer-isocyanate resins, styrene-butadiene rubber resins, nitrile rubber resins, acetal resins, phenol resins, polyamide resins, polyimide resins, melamine resins, urea resins, brominated resins, starch resins, polyester resins, and polyolefin resins.

18. The pressure-sensing device according to claim 1, wherein the electrode is in contact with part or all of a surface of the curable resin layer, and the electrode is not disposed in contact with a surface of the polymeric piezoelectric element.

* * * * *